United States Patent
Huang et al.

(10) Patent No.: US 10,243,287 B1
(45) Date of Patent: Mar. 26, 2019

(54) RISER CARD

(71) Applicant: QUANTA COMPUTER INC., Taoyuan (TW)

(72) Inventors: Jen-Hsuen Huang, Taoyuan (TW); Fa-Da Lin, Taoyuan (TW); Pin-Hao Hung, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 15/963,323

(22) Filed: Apr. 26, 2018

(51) Int. Cl.
| | |
|---|---|
| *H01R 12/00* | (2006.01) |
| *H01R 12/70* | (2011.01) |
| *H05K 1/11* | (2006.01) |
| *H01R 12/73* | (2011.01) |
| *H01R 12/72* | (2011.01) |
| *H05K 1/14* | (2006.01) |

(52) U.S. Cl.
CPC ....... *H01R 12/7082* (2013.01); *H01R 12/721* (2013.01); *H01R 12/737* (2013.01); *H05K 1/117* (2013.01); *H05K 1/141* (2013.01); *H05K 2201/044* (2013.01); *H05K 2201/09063* (2013.01); *H05K 2201/1031* (2013.01); *H05K 2201/10189* (2013.01); *H05K 2201/10333* (2013.01); *H05K 2201/10409* (2013.01)

(58) Field of Classification Search
CPC .............. H01R 12/7082; H01R 12/721; H01R 12/737; H05K 1/117; H05K 1/141; H05K 2201/044; H05K 2201/09063; H05K 2201/10189; H05K 2201/1031; H05K 2201/10333; H05K 2201/10409
USPC ..................................................... 439/55–65
See application file for complete search history.

(56) References Cited

U.S. PATENT DOCUMENTS

| | | | | | |
|---|---|---|---|---|---|
| 5,038,308 | A | * | 8/1991 | Le ............................. | G06F 1/18 361/796 |
| 6,491,526 | B2 | * | 12/2002 | Leman ..................... | G06F 1/184 361/752 |
| 7,458,815 | B2 | * | 12/2008 | Fallah-Adl ........... | H05K 7/1451 361/695 |
| 9,601,851 | B2 | * | 3/2017 | Jacoby ................. | H01R 12/721 |
| 9,979,109 | B2 | * | 5/2018 | Kelaher ............... | H01R 12/737 |

OTHER PUBLICATIONS

HPE Cloudline CL2600 Gen10 Server User and Maintenance Guide, Dec. 2018, p. 78 and p. 94, Part Number: P08745-002, Edition 2; https://supporthpe.com/hpesc/public/home/result?qt=HPE+Cloudline+CL2600+Gen10+Server+User+and+Maintenance+Guide; 2018 Hewlett Packard Enterprise Development LP.

* cited by examiner

*Primary Examiner* — Khiem Nugyen
(74) *Attorney, Agent, or Firm* — Nixon Peabody LLP; Zhou Lu

(57) ABSTRACT

A riser card is disclosed. The riser card includes a circuit board that has two sides, two longitudinal edges extending along a length of the board, and two orthogonal edges extending along a width of the board. The card also includes a first bus connector along one of the longitudinal edges; a second bus connector on one side of the board extending substantially parallel to the longitudinal edges; and a third bus connector on the other side of the board extending substantially parallel to the orthogonal edges. The second bus connector is configured to connect an add-on unit to the card so that the add-on unit extends substantially perpendicular from the board. The third bus connector is configured to connect an add-on unit to the card so that the add-on unit extends substantially parallel to the board and the first edges.

10 Claims, 5 Drawing Sheets

RISER CARD

FIELD OF THE INVENTION

The present invention relates to add-on units, and more specifically to an apparatus and method for connecting add-on units to existing motherboards.

BACKGROUND

Space for connecting add-on units to a motherboard is typically limited within a computer system, such as a server system. Space is limited particularly within a blade server system, which includes a high density of components connected to the motherboard with little additional space for expansion.

FIG. 1 illustrates one example of a motherboard 100 for a half-width server system with a high density of components. In this example, there is little to no space to add one or more add-on units based on the presence of, for example, one or more platform controller hubs (PCHs), baseboard management controllers (BMCs), and/or application-specific integrated circuits (ASICs) taking up much of the space on the motherboard 100.

A storage card based on a M.2 bus connector is one example of an add-on unit that is difficult to add to an existing motherboard within a computer system. Given the dimensions and configuration of the M.2 storage card, such as its length, the card potentially needs to occupy a lot of space to connect to the motherboard. Yet, the benefits of an M.2 storage card make it beneficial to have within the computer system.

Accordingly, there is a need for apparatuses that overcome the foregoing drawbacks.

SUMMARY

The various embodiments concern apparatuses for adding one or more add-on units to a computer system, such as a server system, and the resulting computer system.

The various embodiments further concern a riser card for adding one or more add-on units to a motherboard, such as a motherboard within a server system, and the resulting computer system.

For example, a riser card according to a first embodiment as an additional bus connector on a bottom side for connecting an add-on unit thereto and parallel to the riser card.

A riser card for connecting an add-on unit to a motherboard, according to a second embodiment, includes a circuit board having a first side and a second side, with the second side being opposite the first side. The circuit board further includes first edges between the first side and the second side, and extending along a length of the circuit board. The circuit board further includes second edges between the first side and the second side, and extending along a width of the circuit board.

The riser card further includes a first bus connector along one edge of the first edges for connecting the riser card to the motherboard. The riser card also includes a second bus connector on the first side of the circuit board that extends substantially parallel to the first edges along the length of the circuit board. The second bus connector is configured to connect a first add-on unit to the riser card extending substantially perpendicular from the circuit board. The riser card also includes a third bus connector on the second side of the circuit board that extends substantially parallel to the second edges along the width of the circuit board. The third bus connector is configured to connect a second add-on unit to the riser card extending substantially parallel to the circuit board and the first edges.

In some implementations, a width of the third bus connector is substantially equal to the width of the circuit board. In some alternative implementations, a width of the third bus connector is less than the width of the circuit board.

In some implementations, the first bus connector can be a board-to-board connector or an edge connector; the second bus connector can be a Peripheral Component Interconnect Express (PCIe) connector or card-edge type of connector; and the third bus connector is an M.2 connector.

A riser card for connecting a Peripheral Component Interconnect Express (PCIe) card and an M.2 storage card to a motherboard of a computer system, according to a third embodiment, includes a circuit board having a top side; a bottom side opposite the top side; longitudinal edges between the top side and the bottom side extending along a length of the circuit board; and orthogonal edges between the top side and the bottom side extending along a width of the circuit board. The riser card also includes a bus connector edge along one of the longitudinal edges for connecting the riser card to the motherboard. The riser card also includes a PCIe connector or a card-edge type of connector on the top side of the circuit board extending substantially parallel to the longitudinal edges along the length of the circuit board. The PCIe connector or card-edge type of connector is configured to connect the PCIe card to the riser card so that the PCIe card extends substantially perpendicular away from the circuit board and parallel to the motherboard. The riser card also includes an M.2 connector on the bottom side of the circuit board extending substantially parallel to the orthogonal edges along the width of the circuit board. The M.2 connector is configured to connect the M.2 storage card to the riser card so that the M.2 storage card extends substantially parallel to the circuit board and the longitudinal edges.

In some implementations, a width of the M.2 connector can be substantially equal to the width of the circuit board. In the alternative, a width of the M.2 connector is less than the width of the circuit board.

In some implementations, the bus connector edge is a board-to-board or edge connector.

DETAILED DESCRIPTION

Figure 1:
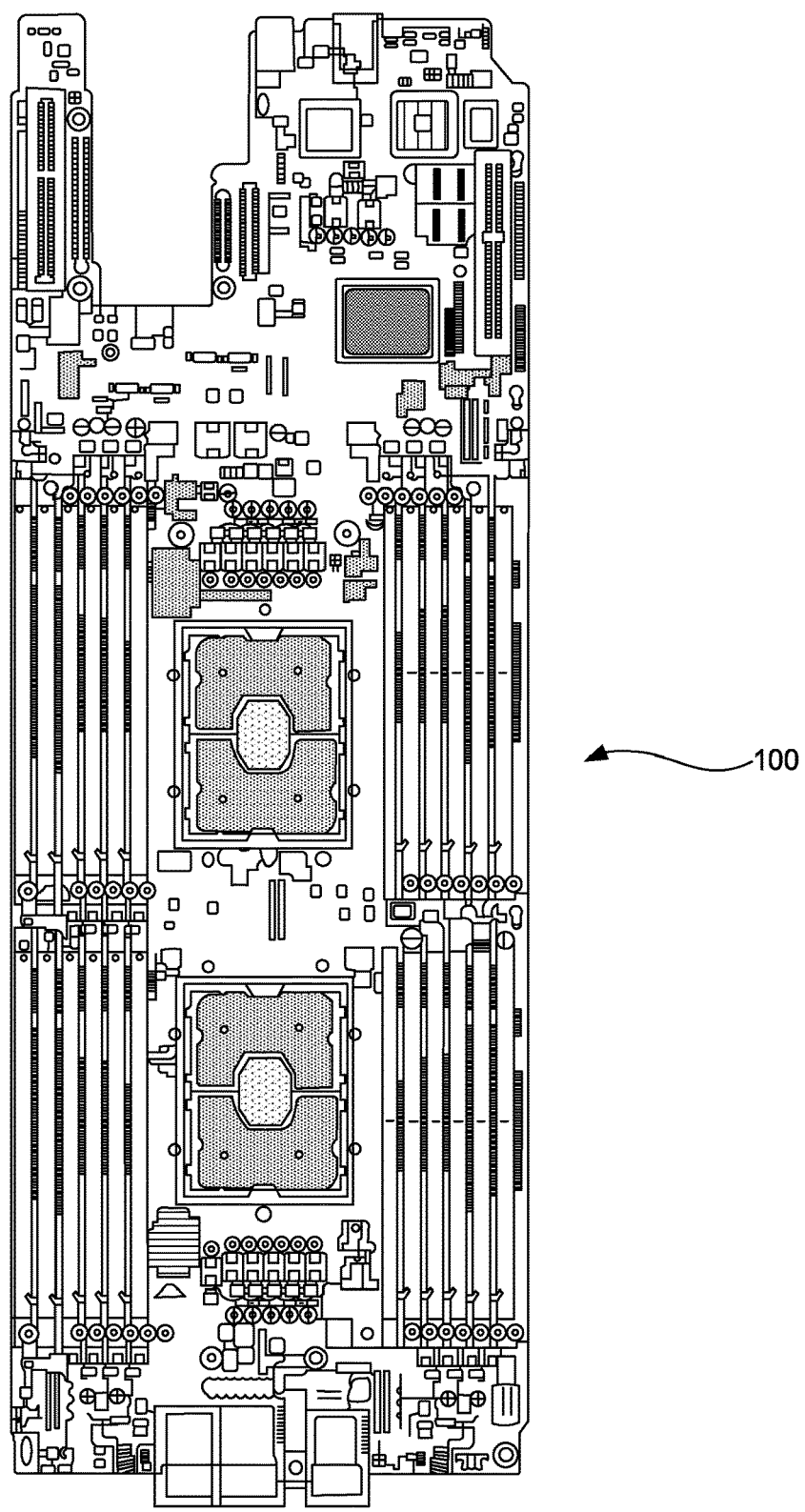
FIG. 1 illustrates a view of a conventional motherboard that is useful for describing the various embodiments.

The various embodiments are described with reference to the attached figures, wherein like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events.

To that extent, elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

As noted above, the spacing constraints in computer systems, and particularly server systems, make it difficult or even impossible to add additional add-on units. Accordingly, the various embodiments of the present disclosure provide an approach for the addition of add-on units that takes advantage of space currently available within computer systems. In particular, the various embodiments utilize the additional space found on the bottom of riser cards to add one or more add-on units. This is illustrated in FIGS. 2A and 2B.

Figure 2A:
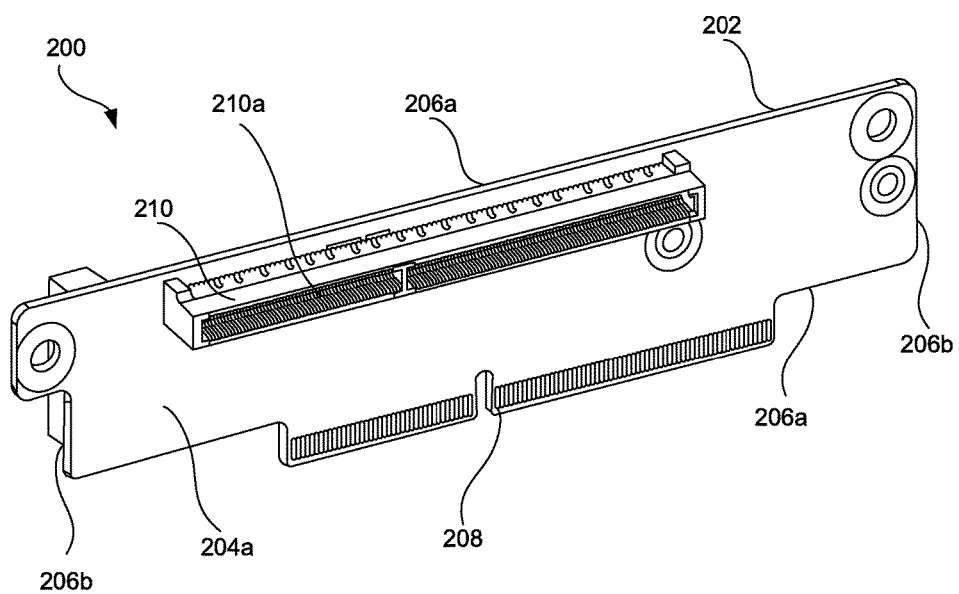
FIG. 2A illustrates a top side view of a riser card, in accordance with an embodiment.
Figure 2B:
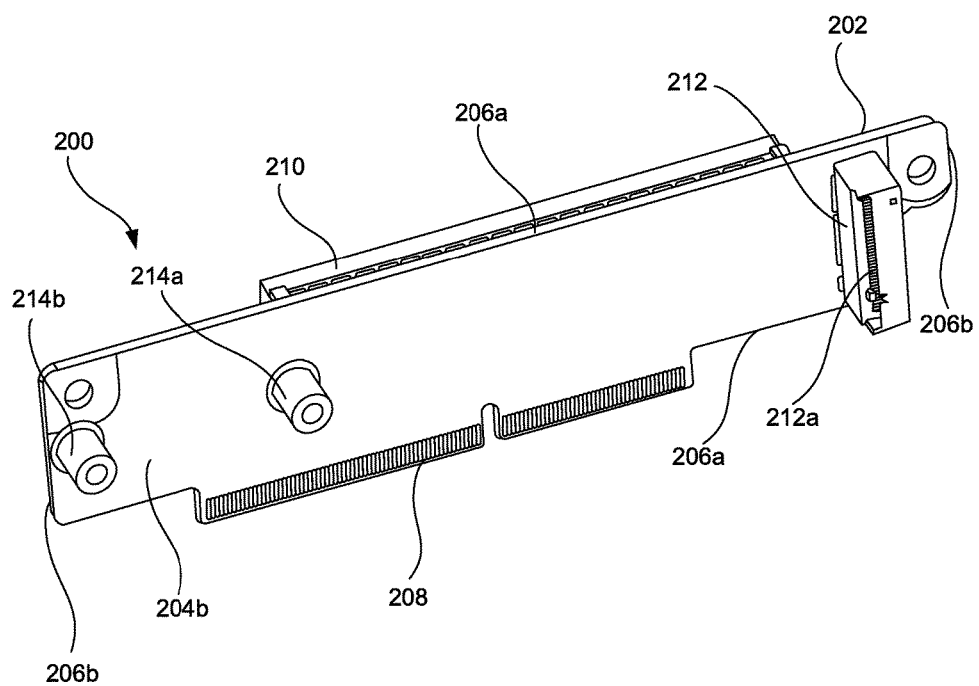
FIG. 2B illustrates a bottom side view of the riser card of FIG. 2A, in accordance with an embodiment.

FIGS. 2A and 2B illustrate a riser card 200, in accordance with an embodiment. The riser card 200 includes a circuit board 202. The circuit board 202 can be, for example, a printed circuit board (PCB) manufactured according to any known processes. However, the various embodiments of the present disclosure are not limited in this regard. Rather, any other technologies for forming a substrate, or other substantially planar structure for mechanically supporting and electrically connecting various electronic components to a motherboard, or other main board, can be used in place of a PCB.

The circuit board 202 has a first or top side 204a (in FIG. 2A), and a second or bottom side 204b opposite the top side 204a (in FIG. 2B). The circuit board 202 further has longitudinal side edges 206a that extend along the length of the circuit board 202. The longitudinal side edges 206a separate the top side 204a from the bottom side 204b. The circuit board 202 also has orthogonal side edges 206b that extend along the width of the circuit board 202. The orthogonal side edges 206b also separate the top side 204a from the bottom side 204b.

Although the sides 204a and 204b, and the edges 206a and 206b, are described as being first, second, top, bottom, longitudinal, orthogonal, etc., they can have varying descriptions depending on the frame of reference, and the descriptions are not meant to be limiting. For example, the top side 204a can be the bottom side, and the bottom side 204b can be the top side, with the riser card 200 in a flipped orientation.

The circuit board 202 includes a bus connector 208 along one of the longitudinal side edges 206a. The bus connector 208 allows the riser card 200 to electrically connect to a corresponding bus connector of a motherboard, such as the motherboard 100 of FIG. 1. Although shown as a bus connector edge here, the bus connector 208 can be a bus connector socket in other implementations.

In some implementations, the bus connector 208 is a board-to-board connector or an edge connector. However, the various embodiments of the present disclosure are not limited in this regard. Rather, any other computer bus can be used in the various embodiments without limitation. By way of example, the bus connector 208 can be an Accelerated Graphics Port (AGP) connector, a Peripheral Component Interconnect (PCI) connector, and the like. Relative to PCIe, the bus connector 208 can be a PCIe×1, PCIe×4, PCIe×8, or PCIe×16 connector.

Referring to FIG. 2A, the riser card 200 includes a bus connector 210 on the top side 204a of the circuit board 202. As described further below, the bus connector 210 provides an electrical connection to the circuit board 202 and the bus connector 208, for connecting an add-on unit to a motherboard (e.g., motherboard 100) through the riser card 200.

The bus connector 210 runs substantially parallel to the longitudinal edges 206a along the length of the circuit board 202. The bus connector 210 is configured to connect an add-on unit to the riser card 200. More specifically, the bus connector 210 is configured so that with the riser card 200 connected to a motherboard, the add-on unit extends substantially perpendicular from the circuit board 202 and parallel to a plane defined by the motherboard (in FIG. 4). Thus, the opening 210a of the bus connector 210 faces perpendicularly outward from the circuit board 202. Although shown as a bus connector socket here, the bus connector 210 can be a bus connector edge in other implementations.

The bus connector 210 can be the same or a different type of bus connector as the bus connector 208. In some implementations, the bus connector 210 can be an Accelerated Graphics Port (AGP) connector, a Peripheral Component Interconnect (PCI) connector, Peripheral Component Interconnect Express (PCIe) connector, or any card-edge type of connector 210. Relative to PCIe, the bus connector 208 can be a PCIe×1, PCIe×4, PCIe×8, or PCIe×16 connector. However, the various embodiments of the present disclosure are not limited in this regard. Rather, any other computer bus can be used in the various embodiments without limitation.

Although only one bus connector 210 is shown on the top side 204a of the circuit board 202, various embodiments of the present disclosure can include more than one bus connector 210 on the top side 204a of the circuit board 202. Depending on the length and/or width of the riser card 200, the additional bus connector(s) 210 can be arranged end-to-end along the length of the circuit board, and/or one above the other along the width of the circuit board 202.

Referring to FIG. 2B, the riser card 200 further includes a bus connector 212 on the bottom side 204b of the circuit board 202. The bus connector 212 provides an electrical connection to the circuit board 202 and the bus connector 208, for connecting another add-on unit to the motherboard (e.g., motherboard 100) through the riser card 200. The width of the bus connector 212 can be substantially the same width as the width of the riser card 200, as shown in FIG. 2B. Alternatively, the width of the bus connector 212 can be narrower than the width of the riser card 200.

The bus connector 212 extends substantially parallel to the orthogonal edges 206b along the width of the circuit board 202. The bus connector 212 is arranged to connect an add-on unit to the riser card 200 so that the plane of the add-on unit extends substantially parallel to the plane of the circuit board 202. Specifically, the opening 212a of the bus connector 212 projects parallel to the circuit board 202. Thus, the bus connector 212 allows for an add-on unit to be connected to a motherboard and run perpendicularly to the motherboard.

The bus connector 212 can be the same or a different type of bus connector as the bus connector 208. However, the type of bus connector 212 may be limited by the width of the circuit board 202 and the arrangement of the bus connector 212 on the circuit board 202. Preferably, the bus connector 212 can be an M.2 connector, and the like.

Although only one bus connector 212 is shown on the bottom side 204b of the circuit board 202, there can be more than one bus connector 212 on the bottom side 204b of the circuit board 202 in various embodiments of the present disclosure. Depending on the length and/or width of the riser card 200, the additional bus connector(s) 212 can be side-by-side along the width of the circuit board 202, and/or one in front of the other along the length of the circuit board 202. In various embodiments, depending on the space between the riser card 200 and other components within a computer system, the additional bus connector(s) 212 can be stacked on top of each other. Accordingly, the riser card 200 (of FIGS. 2A and 2B) allows for the addition of one or more add-on units, without changing the arrangement of the motherboard, by using space already present within a computer system.

In one or more embodiments, the bus connector 210 is selected to be a surface mount device (SMD) type rather than a dual in-line package (DIP) type to avoid interfering with the bus connector 212 and/or add-on unit connected to the bus connector 212 on the bottom side 204b of the riser card 200. However, according to some embodiments, the bus connector 212 can provide enough clearance off of the bottom side 204b of the riser card 200 to allow for a DIP type bus connector 210.

In one or more embodiments, the riser card 200 can include one or more screw hole pillars 214a and 214b to assist in securing an add-on unit to the bus connector 212 and circuit board 202. However, the screw hole pillars 214a and 214b can be optional. The screw hole pillars 214a and 214b can be positioned along the length of the bottom side 204b of the circuit board 202 according to the desired length of the add-on unit to be connected to the bus connector 212. For example, screw hole pillar 214a can be positioned for shorter add-on units and screw hole pillar 214b can be positioned for longer add-on units. The positions of the bus connectors 210 and 212 and the positions of the screw hole pillars 214a and 214b must be considered together when designing the circuit board 202 to prevent interference from the bus connector 210 with the bus connector 212, screw hole pillars 214a and 214b, and/or add-on unit(s).

Figure 3:
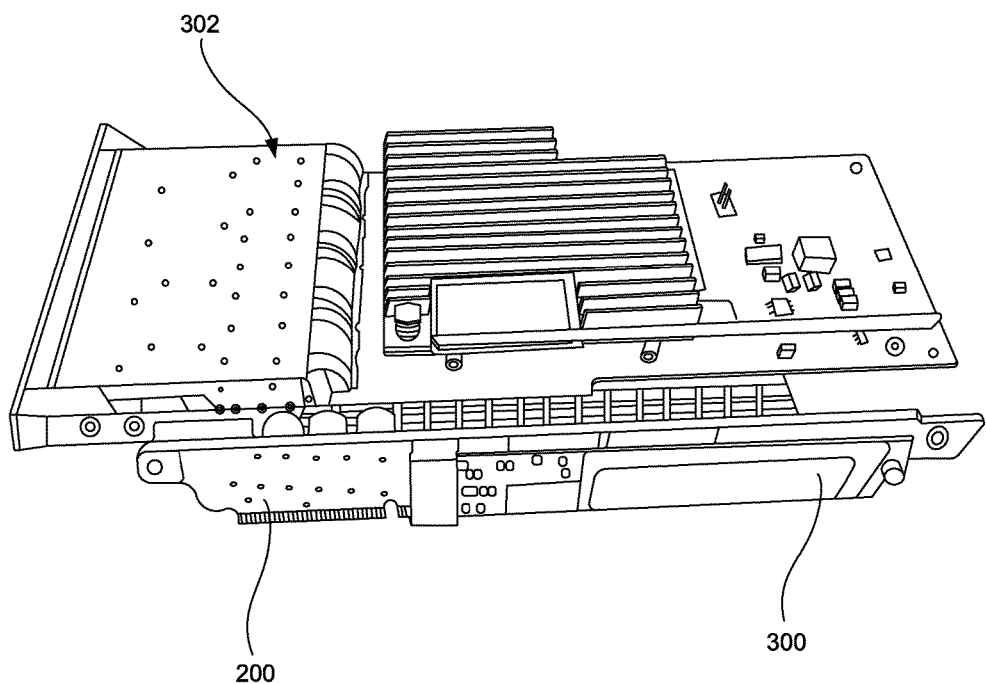
FIG. 3 illustrates a perspective view of the riser card of FIGS. 2A and 2B with two add-on units connected thereto, in accordance with an embodiment.

FIG. 3 illustrates a perspective view of the riser card of FIGS. 2A and 2B with two add-on units 300 and 302 connected thereto, in accordance with an embodiment. The add-on units 300 and 302 can be various types of add-on units found in a computer system. FIG. 3 illustrates an M.2 storage card for add-on unit 300 and a PCIe card for add-on unit 302, but the various embodiments are not limited in this regard, except for the space available for an add-on unit.

Figure 4:
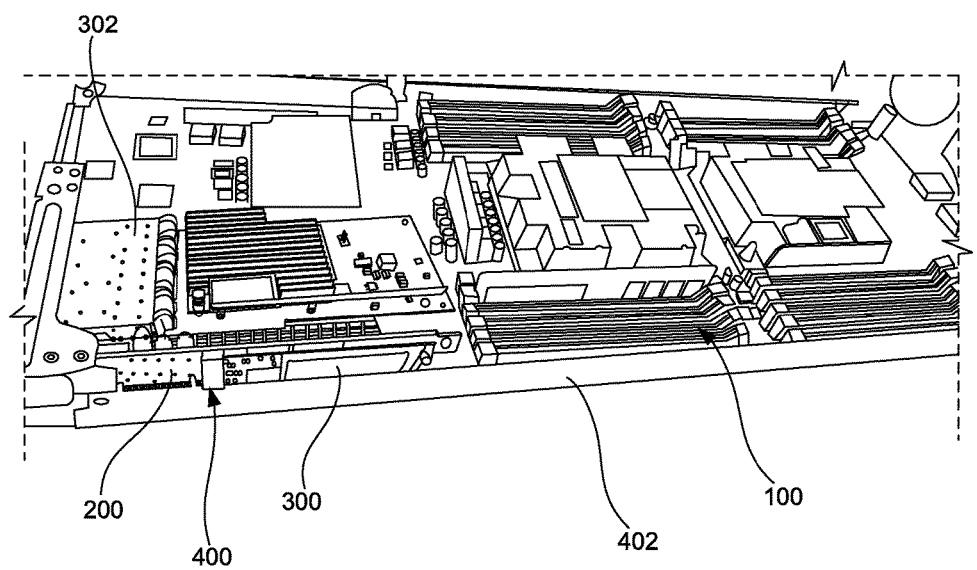
FIG. 4 illustrates a perspective view of the riser card and two add-on units of FIG. 3 connected to the motherboard of FIG. 1, in accordance with an embodiment.

FIG. 4 illustrates a perspective view of the riser card 200 and the two add-on units 300 and 302 of FIG. 3 connected to the motherboard 100 (of FIG. 1), in accordance with an embodiment. As shown, the riser card 200 allows the add-on unit 300 to fit within the space 400 between the riser card 200 and the rail 402 holding the motherboard 100. Prior to the riser card 200, the space 400 was wasted within a computer system. However, based on the configuration of the riser card 200 and the bus connector 212 thereon, the add-on unit 300 can be accommodated within the computer system. Moreover, no changes need to be made within the computer system.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an," and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A riser card for connecting one or more add-on units to a motherboard, the riser card comprising:
   a circuit board having a first side, a second side opposite the first side, first edges between the first side and the second side extending along a length of the circuit board, and second edges between the first side and the second side extending along a width of the circuit board;
   a first bus connector along one edge of the first edges for connecting the riser card to the motherboard;
   a second bus connector on the first side of the circuit board and extending substantially parallel to the first edges along the length of the circuit board, the second bus connector being configured to connect a first add-on unit to the riser card extending substantially perpendicular from the circuit board; and
   a third bus connector on the second side of the circuit board and extending substantially parallel to the second edges along the width of the circuit board, the third bus connector being configured to connect a second add-on unit to the riser card extending substantially parallel to the circuit board and the first edges.

2. The riser card of claim 1, wherein a width of the third bus connector is substantially equal to the width of the circuit board.

3. The riser card of claim 1, wherein a width of the third bus connector is less than the width of the circuit board.

4. The circuit card assembly of claim 1, wherein the first bus connector is a board-to-board connector or an edge connector.

5. The circuit card assembly of claim 1, wherein the second bus connector is a Peripheral Component Interconnect Express (PCIe) connector or a card-edge type of connector.

6. The circuit card assembly of claim 1, wherein the third bus connector is an M.2 connector.

7. A riser card for connecting a Peripheral Component Interconnect Express (PCIe) card and an M.2 storage card to a motherboard of a computer system, the riser card comprising:
- a circuit board having a top side, a bottom side opposite the top side, longitudinal edges between the top side and the bottom side extending along a length of the circuit board, and orthogonal edges between the top side and the bottom side extending along a width of the circuit board;
- a bus connector edge along one of the longitudinal edges for connecting the riser card to the motherboard;
- a PCIe connector on the top side of the circuit board extending substantially parallel to the longitudinal edges along the length of the circuit board, the PCIe connector being configured to connect the PCIe card to the riser card so that the PCIe card extends substantially perpendicular away from the circuit board and parallel to the motherboard; and
- an M.2 connector on the bottom side of the circuit board extending substantially parallel to the orthogonal edges along the width of the circuit board, the M.2 connector being configured to connect the M.2 storage card to the riser card so that the M.2 storage card extends substantially parallel to the circuit board and the longitudinal edges.

8. The riser card of claim 7, wherein a width of the M.2 connector is substantially equal to the width of the circuit board.

9. The riser card of claim 7, wherein a width of the M.2 connector is less than the width of the circuit board.

10. The circuit card assembly of claim 7, wherein the bus connector edge is a board-to-board connector or an edge connector.

* * * * *